United States Patent
Bierhuizen

(10) Patent No.: US 9,368,702 B2
(45) Date of Patent: Jun. 14, 2016

(54) MOLDED LENS FORMING A CHIP SCALE LED PACKAGE AND METHOD OF MANUFACTURING THE SAME

(71) Applicant: KONINKLIJKE PHILIPS N.V., Eindhoven (NL)

(72) Inventor: Serge Joel Armand Bierhuizen, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/374,549

(22) PCT Filed: Jan. 15, 2013

(86) PCT No.: PCT/IB2013/050363
§ 371 (c)(1),
(2) Date: Jul. 25, 2014

(87) PCT Pub. No.: WO2013/118002
PCT Pub. Date: Aug. 15, 2013

(65) Prior Publication Data
US 2014/0374786 A1 Dec. 25, 2014

Related U.S. Application Data

(60) Provisional application No. 61/597,366, filed on Feb. 10, 2012.

(51) Int. Cl.
*H01L 21/00* (2006.01)
*H01L 33/58* (2010.01)
(Continued)

(52) U.S. Cl.
CPC ............... *H01L 33/58* (2013.01); *B29C 43/18* (2013.01); *H01L 33/005* (2013.01); *H01L 33/486* (2013.01); *H01L 33/54* (2013.01);
(Continued)

(58) Field of Classification Search
CPC ....... H01L 33/58; H01L 33/005; H01L 33/54; H01L 33/486; H01L 33/60; H01L 2933/0058; H01L 2933/005; H01L 2224/16
See application file for complete search history.

(56) References Cited

U.S. PATENT DOCUMENTS 6,914,327 B2 7/2005 Shizuno
7,473,940 B2 1/2009 Pang
(Continued)

FOREIGN PATENT DOCUMENTS

DE 10008203 A1 8/2001
DE 102008010512 A1 8/2009
EP 1976028 A1 10/2008

*Primary Examiner* — A. Sefer
(74) *Attorney, Agent, or Firm* — Patent Law Group LLP; Brian D. Ogonowsky

(57) ABSTRACT

A wafer-scale process is described that simultaneously encapsulates LED dies, forms lenses over the LED dies, and forms a chip scale package for said dies. An array of LED dies (16A,B) are affixed to an adhesive surface of a temporary support structure (14). The support structure is then brought against a mold (32). A single molding material (40), such as transparent silicone, then encapsulates the top and side surfaces of each LED die and forms a lens (44) over the top surface of each LED die. The molded material does not cover bottom surfaces of bottom electrodes (26, 28) of the LED die so as to allow said electrodes to be directly bonded to pads (56, 58) of a substrate (60), such as a PCB. The temporary support substrate is then removed after the molding process, and the molded material is singulated to separate out the packages.

6 Claims, 3 Drawing Sheets

(51) Int. Cl.
*B29C 43/18* (2006.01)
*H01L 33/48* (2010.01)
*H01L 33/54* (2010.01)
*H01L 33/00* (2010.01)
*H01L 33/60* (2010.01)

(52) U.S. Cl.
CPC ............ *H01L 33/60* (2013.01); *H01L 2224/16* (2013.01); *H01L 2933/005* (2013.01); *H01L 2933/0033* (2013.01); *H01L 2933/0058* (2013.01)

(56) References Cited

U.S. PATENT DOCUMENTS

| | | |
|---|---|---|
| 2008/0122123 A1 | 5/2008 | Pang |
| 2008/0142817 A1 | 6/2008 | Ibbetson |
| 2009/0022198 A1 | 1/2009 | Chen |
| 2009/0065800 A1 | 3/2009 | Wirth |
| 2009/0212316 A1 | 8/2009 | Braune |
| 2009/0212326 A1 | 8/2009 | Sato |
| 2010/0065983 A1 | 3/2010 | Kawakubo |
| 2010/0109025 A1* | 5/2010 | Bhat ............................ 257/88 |
| 2011/0031516 A1 | 2/2011 | Basin |
| 2011/0186901 A1 | 8/2011 | Ushiyama |
| 2011/0248287 A1 | 10/2011 | Yuan |
| 2012/0025242 A1* | 2/2012 | Zeng et al. ..................... 257/98 |
| 2012/0068208 A1* | 3/2012 | Tseng et al. ......... H01L 33/505 257/98 |
| 2012/0205694 A1* | 8/2012 | Chern et al. .................. 257/98 |
| 2013/0020600 A1* | 1/2013 | Yoo .............................. 257/98 |

* cited by examiner

MOLDED LENS FORMING A CHIP SCALE LED PACKAGE AND METHOD OF MANUFACTURING THE SAME

CROSS-REFERENCE TO PRIOR APPLICATIONS

This application is the U.S. National Phase application under 35 U.S.C. §371 of International Application No. PCT/IB2013/050363, filed on Jan. 15, 2013, which claims the benefit of U.S. Patent Application No. 61/597366, filed on Feb. 10, 2012. These applications are hereby incorporated by reference herein.

FIELD OF THE INVENTION

This invention relates to processing light emitting diodes (LEDs) and, in particular, to a method for forming a chip scale LED package.

BACKGROUND

A typical flip-chip LED has reflective p and n contacts on a bottom surface of the LED, and the contacts are directly connected to bonding pads on a rigid submount that is much larger the LED die. Light generated by the LED is primarily emitted through the top surface of the LED surface. In this way, there are no top contacts that block the light, and wire bonds are not needed.

During fabrication, a submount wafer is populated with an array of LED dies. Electrodes formed on the bottom surface of the LED dies are bonded to pads on the top surface of the submount wafer, and the pads lead to more robust pads on the bottom surface of the submount wafer for bonding to a printed circuit board. The LED dies on the submount wafer are then further processed as a batch on the wafer. Such wafer scale processing may optionally remove the growth substrates from the top surfaces of the LED dies, deposit phosphor over the LED dies, encapsulate the LED dies, and form a lens over each LED. Ultimately, the submount wafer is singulated by, for example, sawing to form separate, packaged LEDs.

Wafer scale processing is efficient. However, the submount wafer or other supporting layer that mechanically supports the thin brittle LED die adds cost. Further, the singulation process for typical supporting layers, such as ceramic or metal, is fairly complex in order to avoid breakage, metal burrs, and other problems.

What is needed is a technique for LED packaging that does not suffer from the above drawbacks.

SUMMARY

A wafer-scale process is described that simultaneously encapsulates LED dies, forms lenses over LED dies, and forms a chip scale package for LED dies. A chip scale package is generally only slightly larger in area than the chip itself.

Although the invention is described using flip-chip LEDs in the examples, any type of LED may make use of the invention, such as LEDs having a top wire bond electrode.

Initially, in one embodiment of the invention, an array of semiconductor LEDs is formed on a sapphire growth substrate. Such LEDs may be conventional. The LEDs are then singulated to form LED dies. Instead of the prior art method of mounting the LED dies on a submount wafer, the LED dies are temporarily affixed to a support structure having an adhesive surface. The support structure may be any size, and the LED dies may be placed in any arrangement, such as in columns and rows or staggered.

Conventional wafer scale processing may be then be performed on the LED dies, such as optionally removing the sapphire substrate by using a laser lift-off process or other means, thinning and roughening the exposed n-type layer for increasing light extraction, and depositing a phosphor over the LED dies. In another embodiment, the sapphire substrate is left on and patterned for increased light extraction (reduce TIR). Such processes may be conventional, and additional wafer scale processes may be performed.

The support structure is then brought into contact with a mold containing silicone or other suitable material having desirable encapsulating and lensing properties for the LED dies. The mold is formed such that the silicone forms a lens over each LED die while also forming a rigid structure surrounding each LED die. The bottom electrode(s) of the LED dies are not covered with the silicone since the bottom surfaces of the LED dies are affixed to the support structure.

The silicone is then cured, and the support structure is removed from over the mold. The support structure is then removed from the cured silicone. The resulting structure is then singulated. The singulation is easily accomplished by cleaving through the silicone. The single mold step encapsulates each LED die, forms a lens over each LED dies, and forms a chip scale package for each LED die using a single, integral molded material. The resulting packaged LED die may have its bottom electrode(s) bonded (e.g., ultrasonically or by solder) to any suitable structure, such as to pads of a printed circuit board or other substrate.

BRIEF DESCRIPTION OF THE DRAWINGS

Elements that are the same or equivalent are labeled with the same numeral.

DETAILED DESCRIPTION

Figure 1:
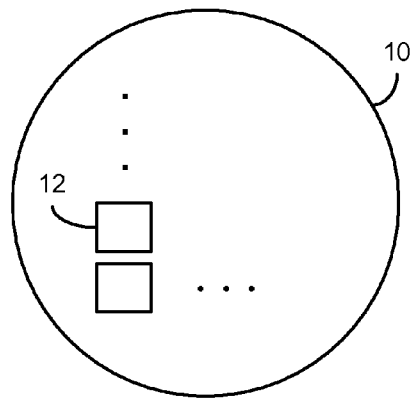
FIG. 1 is a simplified top down view of an LED wafer generally showing areas of different LEDs.

FIG. 1 is a top down view of a conventional LED wafer 10 containing thousands of LED areas 12. The LED areas 12 represent the LED dies after singulation. In the example used, the LEDs are GaN-based LEDs, such as an AlInGaN or InGaN LEDs, for producing blue light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

For a flip-chip, portions of the p-layers and active layer are etched away to expose the n-layer for metallization. In this way, the p contact and n contact are on the same side of the chip. Current from the n-metal contact initially flows laterally through the n-layer. The LED bottom electrodes are typically formed of a reflective metal.

Other types of LEDs that can be used in the present invention include AlInGaP LEDs, which can produce light in the red to yellow range. Non-flip-chip LEDs can also be used.

The sapphire growth substrate may be removed from the wafer 10 using conventional processes such as chemical-mechanical polishing, etching, laser lift-off, or other process. The exposed semiconductor layer may then be roughened for increasing light extraction. In another embodiment, the growth substrate is left on and patterned to increase light extraction. Phosphor may be deposited over the light emitting surface of the LEDs.

The LEDs are tested while in the wafer 10 for performance and categorized (binned).

The wafer 10 is then singulated to separate out the individual LEDs, using a conventional process.

Figure 2:
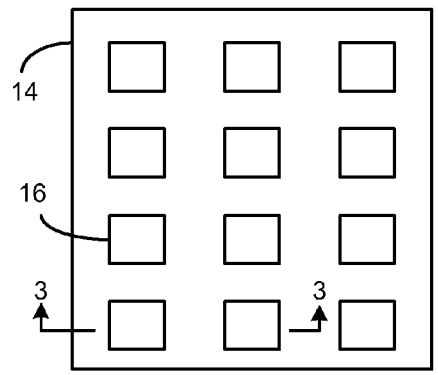
FIG. 2 is a simplified top down view of a temporary support substrate having an array of singulated LED dies affixed to it.

A conventional pick and place machine then positions the individual LED dies on a temporary support structure, as shown in FIG. 2. FIG. 2 is a top down view of a support structure 14 on which the LED dies 16 are positioned.

The support structure 14 may be any size and shape. In one embodiment, the support structure 14 has a sticky surface or other type of adhesive surface, with the electrodes of the LED dies facing the adhesive surface. The support structure 14 may be a thin, stretchable, sticky film. The adhesive surface may be a releasable layer that becomes non-adhesive upon the application of heat, UV, a dissolver, or by another technique. The pitch of the LED dies 16 on the support structure 16 is sufficient to allow a lens to be formed over each LED die 16.

Figure 3:
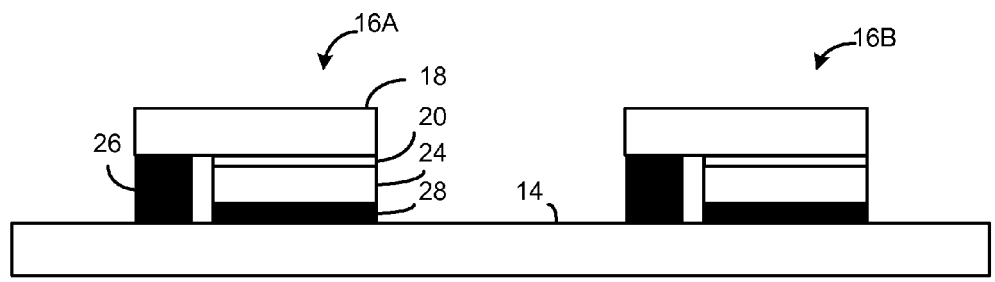
FIG. 3 is a cross-sectional view along line 3-3 in FIG. 2 showing two LED dies mounted on the support structure.

FIG. 3 is a simplified cross-sectional view of the LED dies 16 and support structure 14 along line 3-3 of FIG. 2. The exemplary LED dies 16A and 16B (referred to as LEDs 16) generally comprise an epitaxially grown semiconductor N-type layer 18, a semiconductor active layer 20, and a semiconductor P-type layer 24. For a flip-chip, portions of the P-type layer 24 and active layer 20 are etched away to expose the N-type layer 18, and an N-electrode 26 is deposited to contact the N-type layer 18. A P-electrode 28 contacts the P-type layer 24. In another embodiment, the LED electrodes 26/28 are distributed as dots on the bottom surface of the LED die for more uniform current spreading. The growth substrate is shown removed over the N-type layer 18 in FIG. 3, but it may instead be in-place.

In one embodiment, the LEDs are AlInGaN and emit blue to amber light.

A phosphor layer may exist at least over the surface of the N-type layer 18 to convert the blue light to, for example, white light.

Figure 4:
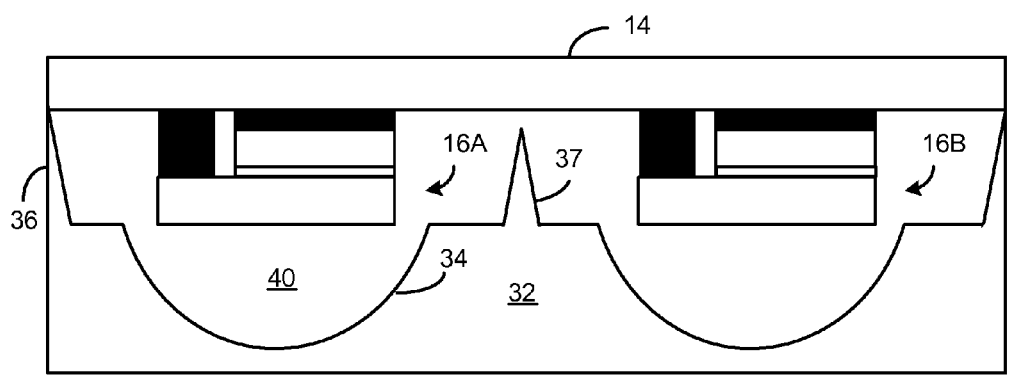
FIG. 4 illustrates the support structure being brought against a mold containing silicone, where the LED dies are immersed in the silicone for encapsulation, while the silicone also forms a lens and chip scale package for the LED dies.

A molding process is then performed as shown in FIG. 4. A mold 32 has indentations 34 corresponding to the desired shape of a lens over each LED die 16. The mold 32 is preferably formed of a metal. The mold 32 may use a thin release layer or may have a non-stick surface, if necessary, to prevent cured molding material sticking to it. The mold 32 also has side walls 36 that act as seals against the periphery of the support structure 14 and also serve as spacers to mold the mold material around the sides of the LED dies 16 to encapsulate them. The mold 32 may include a cleaving structure 37 that reduces any likelihood of damage to the lens during singulation.

In FIG. 4, the mold indentions 34 and area between the side walls 36 have been filled with a heat-curable liquid lens material 40. The lens material 40 may be any suitable optically transparent material such as silicone, an epoxy, or a hybrid silicone/epoxy. A hybrid may be used to achieve a matching coefficient of thermal expansion (CTE). Silicone and epoxy have a sufficiently high index of refraction (greater than 1.4) to greatly improve the light extraction from an AlInGaN or AlInGaP LED as well as act as a lens. One type of silicone has an index of refraction of 1.76.

A vacuum seal is created between the periphery of the support structure 14 and the mold side walls 36 so that each LED die 16 is inserted into the liquid lens material 40 and the lens material 40 is under compression.

The mold 32 is then heated to about 150 degrees centigrade (or other suitable temperature) for a time to harden the lens material 40. The LED dies 16 are now mechanically coupled together by the hardened lens material 40 and can be handled as a single unit.

The support structure 14 is then separated from the mold 32, which removes the encapsulated LED dies 16 from the mold 32. The encapsulated LED dies 16 are then released from the support structure 14 by, for example, pulling the cured lens material 40 off the support structure 14 or releasing the adhesive layer from the lens material 40. The support structure 14 may be reused.

In another embodiment, the lens material 40 is infused with a phosphor or other wavelength material to convert the blue light to another color, including white light. Diffusing particles may also be infused into the lens material 40.

One or more additional silicone lenses may be molded over the lens material 40 to shape the emission.

Figure 5:
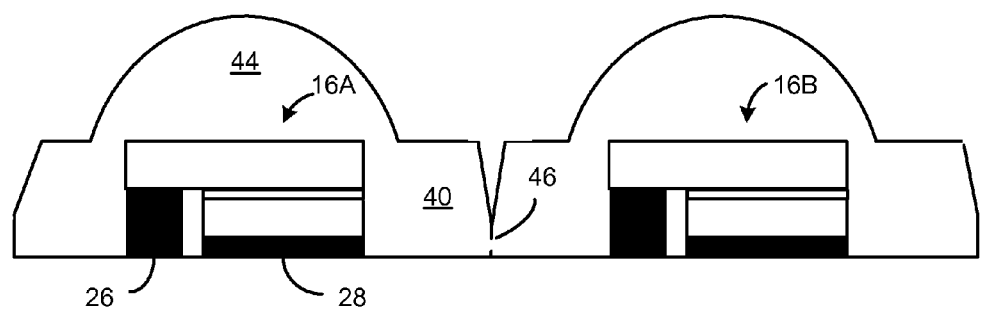
FIG. 5 illustrates the encapsulated LED dies after removal from the mold and after the support structure is removed from the cured silicone.

FIG. 5 illustrates the resulting structure with a molded lens 44 over each LED die 16.

In one embodiment, the molded lens 44 is between 1 mm and 5 mm in diameter. The lens 44 may be any size or shape. The LED dies 16 are encapsulated with the lens material 40, and the lens material 40 forms a chip scale package for each die 16 integral with the encapsulant and lens. The LED electrodes 26/28 are exposed through the bottom of the package so that they may be bonded (e.g., ultrasonically or by solder) to pads of a substrate or printed circuit board. The chip scale packages for the two dies 16 shown in FIG. 5 will be segmented along the dashed line 46. The packages may be segmented by cleaving rather than sawing. Cleaving is simply the application of a downward knife edge along the segmentation lines. This creates very controlled cuts and does not result in waste powder.

In one embodiment, the lens 44 is hemispherical. In other embodiments, the lens 44 may be any shape, such as a side-emitting lens, a Fresnel lens, etc.

Although the lens 44 is shown being about even with the top surface of the LED dies 16, the lens 44 may extend below the top surface. The thickness of the lens material 40 connecting the packages together may be any thickness to enable easy separation in the case of hardened silicone.

Accordingly, the package, the encapsulant, and the lens are formed with a single molding step using one type of material, such as silicone. No additional supporting structure for the package, such as a leadframe, heat sink, or plastic housing, is required, greatly reducing the cost of the package. Optionally, one or more additional silicone lenses may be molded over the lens 44, or attached using an adhesive, to shape the emission.

Figure 6:
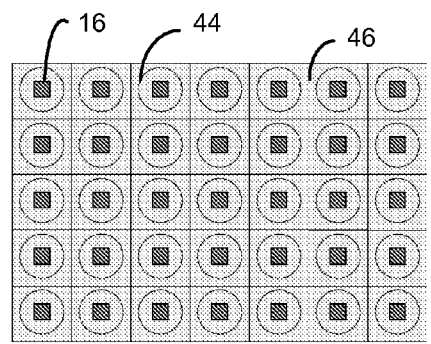
FIG. 6 illustrates one type of configuration of the LED dies after removal from the mold.
Figure 7:
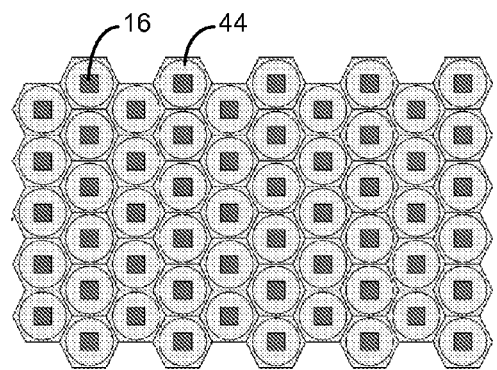
FIG. 7 illustrates a staggered type of configuration of the LED dies after removal from the mold to increase the packing density of the LED dies.

FIGS. 6 and 7 illustrate various possible arrangements of the LED dies 16 prior to segmentation. The arrangement of the LED dies 16 on the support structure 14 may provide maximum packing density. FIG. 6 illustrates a row-column arrangement similar to FIG. 2. This provides ease of singulation since the singulation lines are straight. FIG. 7 illustrates a staggered arrangement, providing increased packing density since there is less space around the hemispherical lens 44. Singulation requires a more complex cut.

Figure 8:
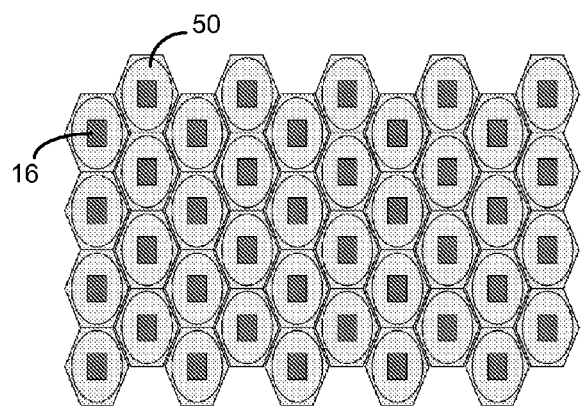
FIG. 8 illustrates how the lenses may be asymmetrical.

FIG. 8 illustrates that the molded lenses 50 may be asymmetrical or any other shape to achieve a desired emission pattern.

Figure 9:
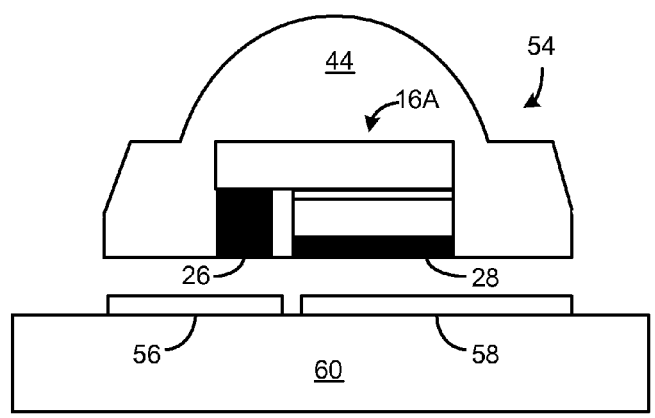
FIG. 9 illustrates a singulated LED having its bottom electrodes being bonded to pads of a substrate, such as a printed circuit board.

FIG. 9 illustrates a singulated package 54 having the LED die electrodes 26/28 being bonded to metal pads 56/58 of a substrate 60 or printed circuit board. The pads 56/58 are ultimately electrically coupled to conduct current from a power source. In one embodiment, the width and length dimensions of the entire package 54 are less than triple the respective dimensions of the die 16 itself. A typical die 16 size is approximately 1×1 mm or less, resulting in the entire package 54 being less than 3×3 mm. In another embodiment, the package 54 is less than double the size of the LED die 16.

Figure 10:
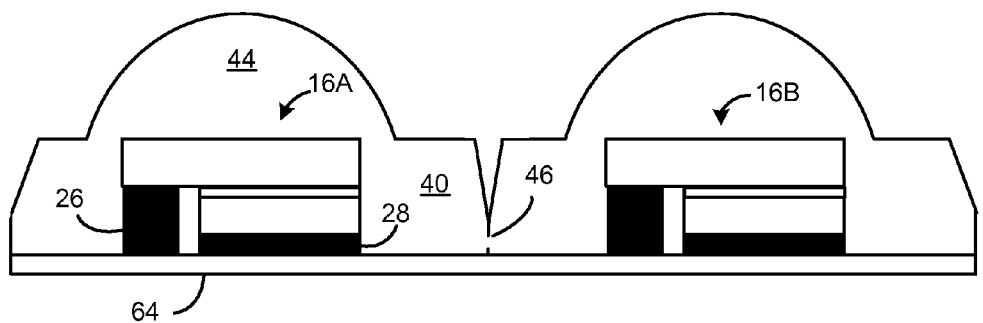
FIG. 10 illustrates the structure of FIG. 5 with a bottom reflective layer.

When soldering the LED package 54 onto a substrate (e.g., FR4, MCPCB, ceramic, etc), the reflectance of the area around the die 16 (through the transparent silicone encapsulant) will depend on the substrate it is bonded/soldered onto. To improve the reflectance, the following optional process step may be performed, which results in the structure of FIG. 10, having a bottom reflective layer 64. After placing the die 16 onto the support structure 14 in FIG. 3 (which may be a stretchable sticky film), silicone (or solgel) infused with reflective TiO2 particles is dispensed over the surface of the substrate 14, but not over the dies 16, and cured. A simple screen printing process may be used, where the screen includes a mask. Contact with the sides of the dies 16 is desirable. After the molding step of FIG. 4, the silicone/TiO2 reflective layer 64 (FIG. 10) will adhere to the bottom of the silicone lens 44 and can be released from the substrate 14 together with the lens 44. The reflective layer 64 will then be part of the package 54, effectively increasing the reflectance of the package (all around the die 16), independent of any customer substrate reflectance.

An alternative, non-molded, method of forming the lenses on an array of the LED dies 16 is through dispensing a droplet of silicone over each die 16 on the support substrate 14. By using a thixotropic silicone material over the dies 16 and providing a low-stick (e.g., Teflon) substrate 14 surface, the surface tension of the silicone will naturally form a dome type shape after dispensing. The silicone is then cured to harden the lens.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of manufacturing a packaged light emitting diode (LED) die comprising:
   forming a plurality of LED dies, each LED die comprising a plurality of semiconductor layers and at least one metal electrode formed on a bottom surface of each of the LED dies to electrically contact at least one of the semiconductor layers, each of the LED dies having a top surface and side surfaces; wherein the at least one metal electrode has a top surface and a bottom surface opposite the top surface, wherein the top surface of the at least one metal electrode is formed on the bottom surface of the LED die;
   mounting the plurality of LED dies on a temporary support structure;
   molding an integral material over the LED dies that encapsulates at least the top surface and the side surfaces of the LED dies and forms a lens over the top surface of each of the LED dies, the integral material not covering the bottom surface of the at least one metal electrode, wherein the integral material extends along the plurality of side surfaces of the LED die and has a base that extends down to the temporary support substrate and to the bottom surface of the LED dies;
   curing the integral material to mechanically connect the LED dies together;
   removing the LED dies and integral material from the support structure; and
   singulating the integral material to singulate the LED dies to create individual packaged LED dies such that the at least one metal electrode remains exposed for bonding to another electrode after the lens is formed.

2. The method of claim 1 wherein phosphor is infused in the integral material.

3. The method of claim 1 further comprising forming a reflective layer on the temporary support structure after the step of mounting the plurality of LED dies on the temporary support structure, wherein the integral material sticks to the reflective layer during the step of removing the LED dies and integral material from the support substrate, resulting in the packaged LED dies having the reflective layer.

4. The method of claim 1 wherein the packaged dies contain no leadframe such that the at least one metal electrode is configured to be bonded to metal pads of a support structure.

5. The method of claim 1 wherein the integral material forms the only lens over the die.

6. The method of claim 1 wherein each packaged LED die has width and length dimensions, wherein the width and length dimensions of the packaged LED die are less than triple the respective width and length dimensions of the LED die.

* * * * *